United States Patent
Chen et al.

(10) Patent No.: US 12,181,503 B1
(45) Date of Patent: Dec. 31, 2024

(54) SYSTEMS AND METHODS FOR ISOLATION RESISTANCE MONITORING IN A BATTERY BANK

(71) Applicant: Wisk Aero LLC, Mountain View, CA (US)

(72) Inventors: Hongxia Chen, Mountain View, CA (US); Lewis Romeo Hom, Mountain View, CA (US)

(73) Assignee: Wisk Aero LLC, Mountain View, CA (US)

( * ) Notice: Subject to any disclaimer, the term of this patent is extended or adjusted under 35 U.S.C. 154(b) by 399 days.

(21) Appl. No.: 17/749,030

(22) Filed: May 19, 2022

Related U.S. Application Data

(60) Provisional application No. 63/202,403, filed on Jun. 9, 2021.

(51) Int. Cl.
*G01R 31/52* (2020.01)
*G01R 27/02* (2006.01)
*G01R 31/36* (2020.01)
*G01R 31/3835* (2019.01)
*H01M 10/42* (2006.01)

(52) U.S. Cl.
CPC ....... *G01R 27/025* (2013.01); *G01R 31/3646* (2019.01); *G01R 31/3835* (2019.01); *G01R 31/52* (2020.01); *H01M 10/4285* (2013.01)

(58) Field of Classification Search
CPC .............. G01R 27/025; G01R 31/3646; G01R 31/3835; G01R 31/52; H01M 10/4285
See application file for complete search history.

(56) References Cited

U.S. PATENT DOCUMENTS

| 8,178,227 B1 | 5/2012 | Hermann |
| 8,350,529 B2 * | 1/2013 | Loncarevic ........... H02J 7/0014 320/122 |
| 9,063,179 B2 | 6/2015 | Bober |

(Continued)

FOREIGN PATENT DOCUMENTS

CN          203520081 U          4/2014

OTHER PUBLICATIONS

Dai et al., "Insulation detection of electric vehicle batteries", AIP Conference Proceedings 1971, 040021 (2018), 2018, 7 pages.

*Primary Examiner* — Giovanni Astacio-Oquendo
*Assistant Examiner* — Haidong Zhang
(74) *Attorney, Agent, or Firm* — Kilpatrick Townsend & Stockton LLP

(57) ABSTRACT

Systems and methods for monitoring isolation resistance of individual batteries in a battery bank enable measurement of isolation resistance to be performed for different batteries at different times, thereby preventing the measurements from interfering with each other. In some embodiments, each battery in a battery bank has a battery monitoring system controller, and each battery monitoring system controller operates independently of the other battery monitoring system controllers in the battery bank. Each battery monitoring system controller can perform measurements of isolation resistance at regular intervals. Each battery monitoring system controller determines a start time for its measurements in a manner such that no two controllers perform isolation resistance measurements at the same time.

20 Claims, 10 Drawing Sheets

(56) References Cited

U.S. PATENT DOCUMENTS

| | | | |
|---|---|---|---|
| 9,184,605 B2 * | 11/2015 | Chang | H04B 3/00 |
| 9,696,384 B2 | 7/2017 | Wang et al. | |
| 9,720,049 B2 | 8/2017 | Anzicek | |
| 10,295,584 B2 | 5/2019 | Dulle et al. | |
| 10,391,864 B2 * | 8/2019 | Patel | B60L 3/0046 |
| 2008/0252257 A1 | 10/2008 | Sufrin-disler et al. | |
| 2013/0027049 A1 | 1/2013 | Sukup | |
| 2013/0066572 A1 * | 3/2013 | Terashima | H02J 7/0016 |
| | | | 320/136 |

* cited by examiner

| | | CONDITIONS | | | |
|---|---|---|---|---|---|
| BMS Modes | Active | Testing Off | Measurement failure | $R_{iso} > R_{min}$ | $R_{iso} < R_{min}$ |
| | Maintenance | Charger Off | Charger On | | |
| | Idle | All conditions | | | |
| Outputs | RiFault | F | T | F | T |
| | RiValue | (NAN) | (NAN) | $R_{iso}$ | $R_{iso}$ |
| | RiValid | F | F | T | T |

FIG. 9

SYSTEMS AND METHODS FOR ISOLATION RESISTANCE MONITORING IN A BATTERY BANK

CROSS-REFERENCE TO RELATED APPLICATION

This application claims the benefit of U.S. Provisional Application No. 63/202,403, filed Jun. 9, 2021, the disclosure of which is incorporated herein by reference.

TECHNICAL FIELD

The present disclosure relates generally to battery monitoring and in particular to systems and methods for monitoring isolation resistance of multiple batteries in a battery bank.

BACKGROUND

A battery is an electrochemical device that can convert stored chemical energy to electrical energy. Numerous examples of battery technologies are known in the art, including lithium ion batteries, nickel-metal-hydride batteries, lead-acid batteries, nickel-cadmium batteries, alkaline batteries, and so on. Batteries can be made in many sizes and with a range of operating characteristics (e.g., voltage (or electrical potential), maximum current, charge capacity, and so on). To support high voltage or high charge capacity, battery packs can be made by electrically connecting multiple battery cells in series and/or in parallel. Depending on the technology, some types of batteries can be rechargeable by connecting to a source of charging current.

Batteries (particularly lithium-ion batteries) have found a wide variety of uses, including as a portable power source to drive the motors of vehicles such as cars, aircraft, watercraft, and so on. In some cases, a battery or battery pack may be the sole power source for a vehicle. A vehicle that relies solely on battery power for propulsion may abruptly lose its motive power if the battery fails. Depending on the state of the vehicle when a battery failure occurs, the consequences can range from inconvenient to disastrous. Accordingly, it may be desirable to monitor battery performance and detect conditions that may indicate problems, so that the battery can be serviced or replaced before it fails.

SUMMARY

One parameter of interest for monitoring performance of high-voltage batteries in vehicles (and other equipment) is the isolation resistance, which quantifies the electrical isolation between the battery terminals and chassis ground of the vehicle (or other equipment). Ideally the battery is completely isolated from chassis ground so that it is safe to touch either battery terminal and chassis ground at the same time. Where this isolation breaks down, a ground fault occurs, which can potentially be damaging to the battery or dangerous to users of the vehicle (or other equipment). Accordingly, it is desirable to monitor isolation resistance of a battery.

In some vehicles (or other equipment), a battery bank that includes multiple batteries may be used. The batteries can be connected in parallel, which provides redundancy so that the vehicle (or other equipment) can continue to operate even if one battery (or more than one, depending on implementation) fails. The redundant system improves safety but can complicate the process of detecting faults such as isolation breakdown.

According to some embodiments of the invention, systems and methods for monitoring isolation resistance of individual batteries in a battery bank are provided. These systems and methods can enable measurement of isolation resistance to be performed for different batteries at different times, thereby preventing the measurements from interfering with each other. In some embodiments, each battery in a battery bank has a battery monitoring system controller, and each battery monitoring system controller operates independently of the other battery monitoring system controllers in the battery bank. Each battery monitoring system controller can perform measurements of isolation resistance at regular intervals. Each battery monitoring system controller determines a start time for its measurements in a manner such that no two controllers perform isolation resistance measurements at the same time.

Certain embodiments relate to a battery bank that can include multiple batteries, each battery including one or more battery cells; a pair of high voltage bus lines; multiple battery monitoring system controllers, and a control system coupled to the battery monitoring system controllers. The batteries can be coupled in parallel between the high voltage bus lines. Each battery monitoring system controller can be connected to a corresponding one of the batteries. Each battery monitoring system controller can include an isolation resistance measurement circuit coupled to the corresponding one of the batteries and a processing logic circuit configured to: receive a time synchronization signal from the control system; determine, based on the time synchronization signal and a unique identifier assigned to the battery monitoring system controller, a start time for an isolation resistance measurement; operate the isolation resistance measurement circuit to perform an isolation resistance measurement process starting at the start time; report a result of the isolation resistance measurement to the control system; update the start time based on a cycle time that is the same for each battery monitoring system controller; and at the updated start time, repeat the acts of performing the isolation resistance measurement process, reporting the result, and updating the start time. In some embodiments, the start time determined by each battery monitoring system controller can be different from the start time determined by each other battery monitoring system controller, and the start times determined by different battery monitoring system controllers are separated by a duration sufficient to complete the isolation resistance measurement.

Certain embodiments relate to a battery module that can include one or more battery cells, an isolation resistance measurement circuit coupled to the one or more battery cells, and a battery monitoring system controller coupled to the one or more battery cells and to the isolation resistance measurement circuit. The battery monitoring system controller can include a processing logic circuit configured to: receive a time synchronization signal from a control system; determine, based on the time synchronization signal and a unique identifier assigned to the battery monitoring system controller, a start time for an isolation resistance measurement; operate the isolation resistance measurement circuit to perform an isolation resistance measurement process starting at the start time; report a result of the isolation resistance measurement to the control system; update the start time based on a cycle time that is the same for each battery monitoring system controller; and at the updated start time, repeat the acts of performing the isolation resistance measurement process, reporting the result, and updating the start time.

Certain embodiments relate to a method for monitoring isolation resistance in batteries. The method can include: sending a time synchronization signal from a control system to each of a plurality of battery monitoring system controllers, wherein each battery monitoring system controller is coupled to a different one of a plurality of batteries in a battery bank and wherein each battery monitoring system controller stores a unique controller identifier; and within each battery monitoring system controller: determining, based on the time synchronization signal and the unique controller identifier, a start time for an isolation resistance measurement, wherein the start time determined by each battery monitoring system controller is different from the start time determined by each other battery monitoring system controller and wherein the start times determined by different battery monitoring system controllers are separated by a duration sufficient to complete the isolation resistance measurement; in response to the start time arriving, performing an isolation resistance measurement process; reporting a result of the isolation resistance measurement process to the control system; updating the start time based on a cycle time that is the same for each battery monitoring system controller; and in response to the updated start time arriving, repeating the acts of performing the isolation resistance measurement process, reporting the result, and updating the start time.

The following detailed description, together with the accompanying drawings, will provide a better understanding of the nature and advantages of the claimed invention.

BRIEF DESCRIPTION OF THE DRAWINGS

FIG. 9 shows a table summarizing results of isolation resistance measurements that can be reported according to some embodiments.

DETAILED DESCRIPTION

The following description of exemplary embodiments of the invention is presented for the purpose of illustration and description. It is not intended to be exhaustive or to limit the claimed invention to the precise form described, and persons skilled in the art will appreciate that many modifications and variations are possible. The embodiments have been chosen and described in order to best explain the principles of the invention and its practical applications to thereby enable others skilled in the art to best utilize the invention in various embodiments and with various modifications as are suited to the particular use contemplated.

Battery System Overview

Figure 1:
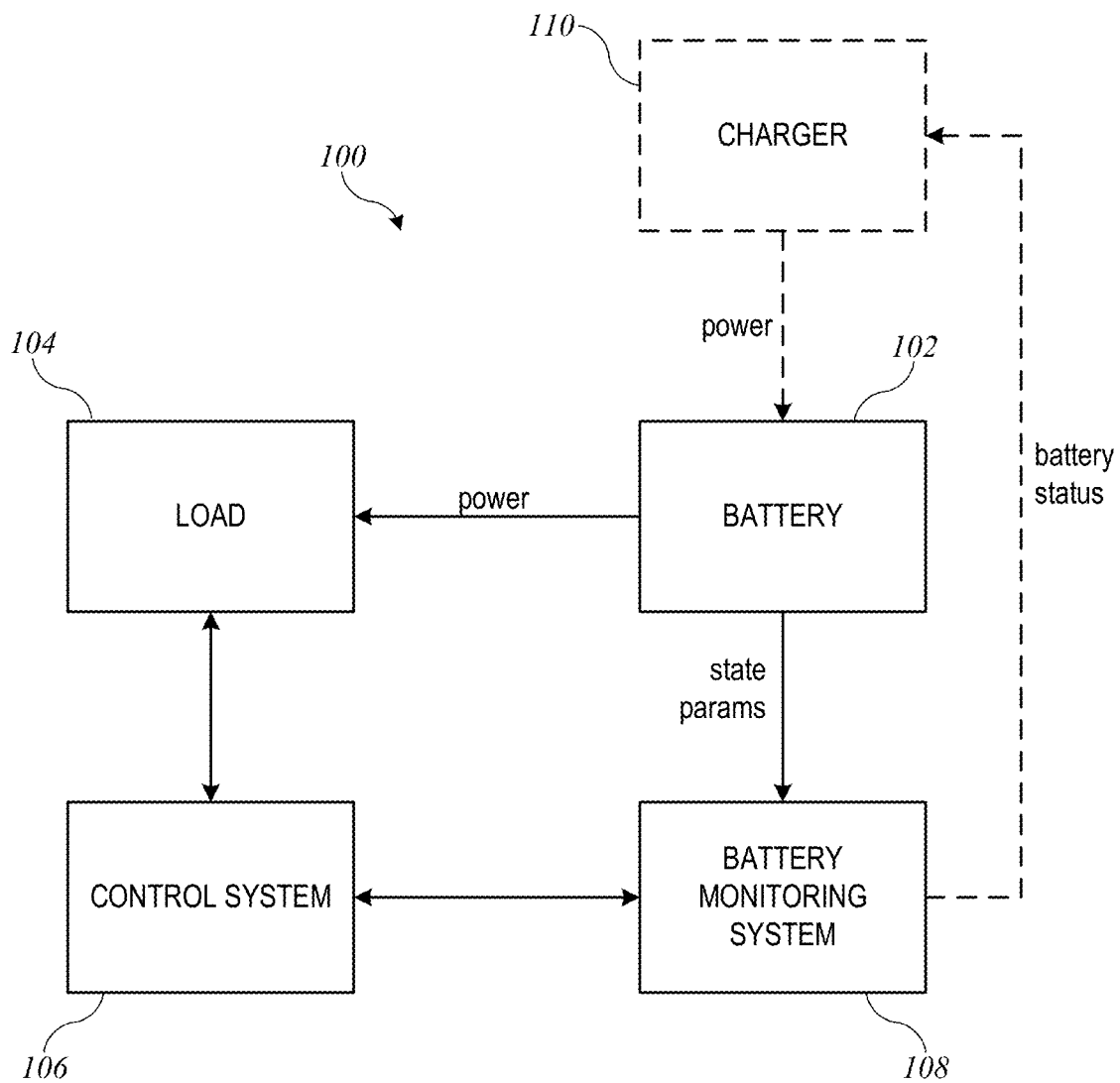
FIG. 1 shows a high-level block diagram of an operating environment for battery monitoring according to some embodiments.

FIG. 1 shows a high-level block diagram of an operating environment 100 for battery monitoring according to some embodiments. Environment 100 can be, for example a powered vehicle such as an aircraft, watercraft, rail vehicle, car, truck, off-road vehicle, or the like. Environment 100 includes a battery 102 that provides power to an electrical load 104 (which can include, for example, a motor). Battery 102 can be any type of battery, including a lithium ion battery, lead-acid battery, nickel-metal-hydride battery, and so on. Battery 102 can be implemented as a single battery cell or as a battery pack that includes multiple battery cells connected together in series and/or in parallel as desired. (As used herein, the term "battery cell" or "cell" can be understood as including a standalone battery or, in the case of a battery pack, one of some number of independently replaceable battery units within the battery pack.) Electrical load 104 can include, for example, a motor (or engine) of the vehicle, or any other battery-powered mechanism or device. Electrical load 104 can draw varying amounts of power from battery 102 at different times. For example, a motor of a vehicle may draw more power when the vehicle is accelerating than when the vehicle is at rest or moving at a constant speed.

A control system 106 communicates with load 104. For instance, control system 106 can send instructions to load 104, e.g., to increase or decrease motor speed, or to enable, disable, or change operating state of any power-consuming component. Control system 106 can also receive feedback from load 104 indicating its operating state, anomalous conditions that may occur, and the like. Control system 106 can include human interface components, such as display screens, indicator lights, speakers, human-manipulable control devices (e.g., keyboard, mouse, touch screen or touch pad, joystick, control wheel, foot pedal, and so on). Control system 106 can be local to load 104 (e.g., in a vehicle of which load 104 includes the motor), or located remotely from load 104 and communicating via an appropriate connection, including short-range or long-range network connections. In some embodiments, control system 106 can include both local and remote elements. For instance, environment 100 can be an autonomous or remotely-piloted vehicle that is monitored and directed from a location external to the vehicle.

In some embodiments, battery 102 is a rechargeable battery that can be recharged by connecting battery 102 to a source of charging power, such as charger 110. Charger 110 can include any system or device that is capable of providing power (or charge) from an external source (e.g., standard wall power or any other power source external to battery 102) to be stored by battery 102; numerous examples are known in the art. Charger 110 can also include control circuitry to control the operation of charger 110, including when and how much power to supply. In some embodiments, battery 102 can be coupled to charger 110 at certain times and decoupled from charger 110 at other times; hence, charger 110 is shown using broken lines. Depending on implementation, battery 102 may or may not be able to provide power to load 104 while receiving power from charger 110. In some embodiments, control system 106 can coordinate the operation of charger 110 with load-powering operation of battery 102.

Battery monitoring system 108 can be coupled to battery 102, to control system 106, and to charger 110. Battery 102 and/or battery monitoring system 108 can be outfitted with sensors and logic circuits to determine various state parameters of the battery, such as isolation resistance. Examples of circuits and processes for determining isolation resistance are described below. Battery monitoring system 108 can determine state parameters from battery 102 in real time (e.g., while load 104 is drawing power from battery 102). Based on the state parameters, battery monitoring system 108 can provide battery status information to control system 106 and/or charger 110. The battery status information can include, for instance, any combination of measured state parameters for battery 102 (including values of isolation resistance), "fault" notifications indicating that some aspect of battery performance (e.g., isolation resistance) has deviated from expectations, and/or any other information that may be available in battery monitoring system 108. Control system 106 and/or charger 110 can use this information to generate alerts to an operator of environment 100, to change the operation of load 104 based on the battery status information, to change the operation of charger 110 (e.g., the rate at which charging power is supplied to battery 102) based on the battery status information, to maintain battery history information for battery 102, and/or to take other responsive action that may be programmed into control system 106.

In one specific example, operating environment 100 corresponds to a battery-powered aircraft that is capable of flying under local or remote control. Load 104 can include the motor of the aircraft, and battery 102 can be the power source for the motor. In such an environment, reliability of battery 102 is critical for enabling the aircraft to safely complete a flight. To provide the necessary amount of power with high reliability, battery 102 can include a high-voltage battery bank made up of multiple battery packs arranged in parallel (which can provide redundancy), with each battery pack incorporating multiple cells arranged in series and/or in parallel. Battery monitoring system 108 can provide real-time information about the status of each battery pack, e.g., on a per-cell or per-battery basis, allowing problems to be detected and addressed before battery failure occurs. For instance, when battery monitoring system 108 generates a notification of a fault, a service technician can be notified, and battery 102 can be repaired or replaced before the next flight, or flight capability may be disabled until the fault is cleared. In this example, battery 102 can be coupled to charger 110 for recharging between flights, and battery monitoring system 108 can continue to provide information about the status of each battery pack during charging.

It should be understood that operating environment 100 is illustrative and not limiting. Any type of battery (including any number and arrangement of battery cells) driving any type of load may be monitored using systems and methods of the kind described herein, and any number of battery cells or batteries can be included in a battery bank.

Figure 2A:
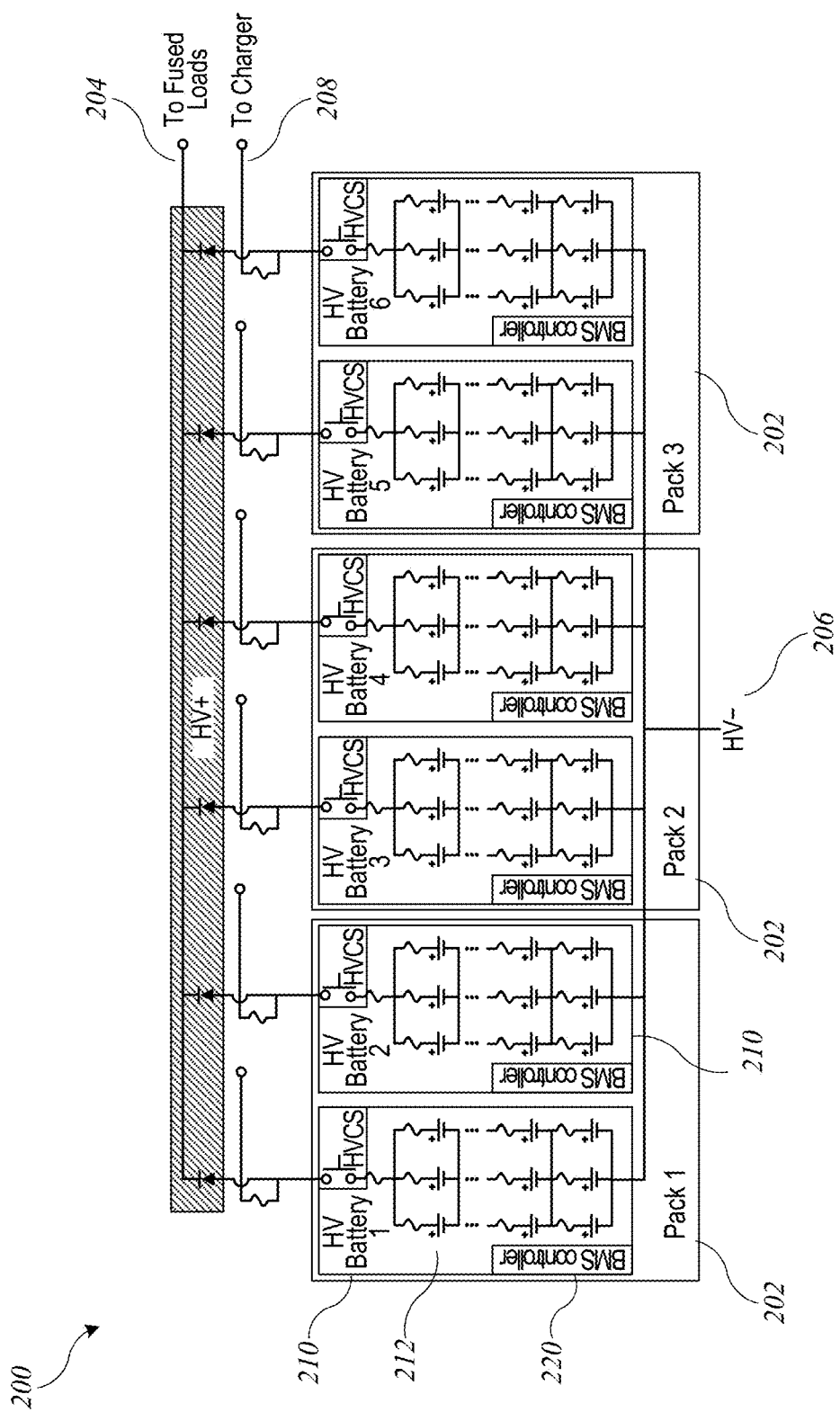
FIG. 2A shows a simplified schematic diagram of a battery bank according to some embodiments.

FIG. 2A shows a simplified schematic diagram of a battery bank 200 according to some embodiments. Battery bank 200 incorporates a battery monitoring system as an embedded system within the battery bank. Battery bank 200 can be used as battery 102 in an operating environment such as operating environment 100 described above. In this example, battery bank 200 includes three high-voltage (HV) battery packs 202 connected in parallel between a first high-voltage bus 204 (which can connect to a load) and a second high-voltage bus 206 (which can be grounded or connected to some other voltage). Battery packs 202 are rechargeable, and charging terminals 208 are provided for connecting each battery in battery pack 202 to a charger.

Each of battery packs 202 includes two HV batteries 210 connected in parallel. Each HV battery 210 includes individual battery cells 212, which can be, e.g., lithium ion cells. For example, each cell 212 may have an operating voltage of 3-5 V, internal resistance of 1-50 mΩ, operating current range of 0-100 A; these parameters can be varied. The number of cells 212 can be quite large. In this example, battery cells 212 within each HV battery 210 are connected in series to form strings having a large number of cells 212 (e.g., 144 cells per string), and three series strings are connected together in parallel within each HV battery 210. Battery bank 200 can provide both a high operating voltage (e.g., overall system voltage in a range from about 400 to 800 V) and a high level of redundancy, such that battery bank 200 can continue to supply power even if some of cells 212 fail.

Each HV battery 210 also includes a battery monitoring system (BMS) controller 220, which can be a component of battery monitoring system 108 of FIG. 1. Each BMS controller 220 can be a printed circuit board with circuitry configured to monitor the status of one or more cells within the HV battery 210. In some embodiments, BMS controller 220 can include a set of BMS "component" boards (not shown) that are capable of monitoring every cell of each HV battery 210. For instance, each HV battery 210 can include 12 BMS component boards, with each BMS component board capable of monitoring 36 cells. The BMS component boards within one HV battery 210 can communicate with the BMS controller 220 of that HV battery 210. In embodiments described below, isolation resistance monitoring is performed for HV battery 210 as a whole (rather than per-cell), and BMS controller 220 can include fixed-function and/or programmable logic circuitry to perform the isolation resistance monitoring.

It should be understood that battery bank 200 is illustrative and not limiting. A battery system can include any number of batteries, and each battery can include any number of cells. Isolation resistance measurements as described herein can be performed for each battery, for each battery pack, or for some group of cells within a battery, as desired.

Figure 2B:
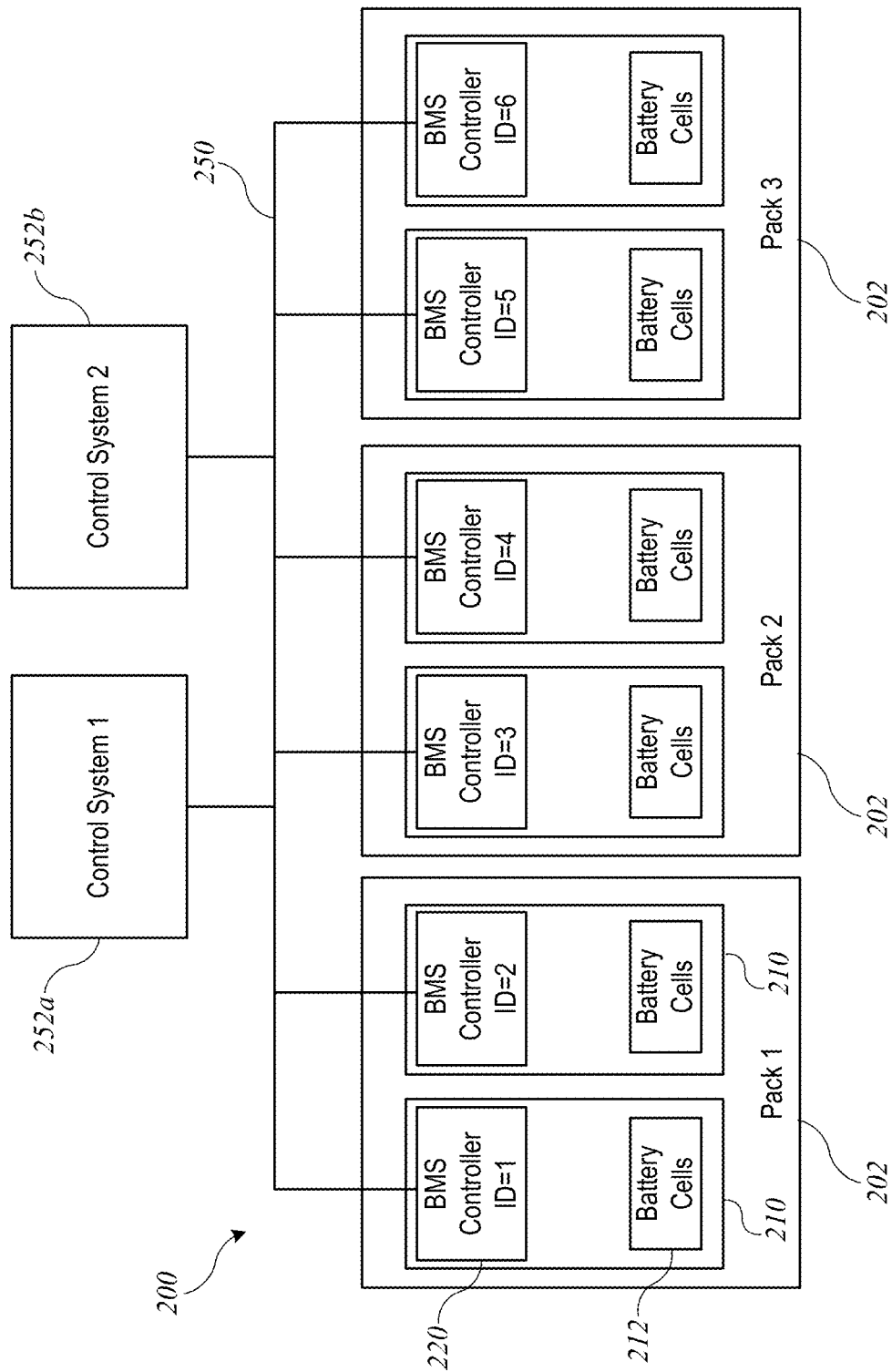
FIG. 2B shows another simplified schematic diagram of a battery bank according to some embodiments.

FIG. 2A highlights electrical connections to battery bank 200. FIG. 2B shows another simplified schematic diagram of battery bank 200 according to some embodiments, with emphasis on control systems relevant to monitoring isolation resistance. As shown in FIG. 2B, each battery pack 202 includes two HV batteries 210. Each HV battery 210 includes battery cells 212 and a BMS controller 220 as described above. Each BMS controller 220 is assigned a unique identifier (ID=1 to 6 in this example), where "unique" indicates that no two BMS controllers 220 in the same battery bank 200 have the same identifier. In some embodiments, the unique identifier can be established using a set of pins and jumpers, or a set of DIP switches or the like, that can be connected in a pattern that maps to the assigned identifier. Thus, the identifier can be assigned when a particular BMS controller 220 is installed into a battery 210. Other techniques for establishing an identifier can be used, provided that the identifier can be persistently stored by BMS controller 220.

Each BMS controller 220 is coupled to a communication bus 250. Also coupled to communication bus 250 are one or more control systems 252. In the example shown, there are two control systems 252a, 252b; in various embodiments, the number of control systems can be one, two, or more. For example, control system 252a can be implemented in a flight computer that controls flight operations of an aircraft powered by battery bank 200. In some embodiments, control system 252b can be implemented in a redundant backup flight computer that can automatically take control of flight operations in the event of a fault or error in the main flight computer. In some embodiments, there can be multiple redundant backups that successively take control. As another example, control system 252a can be implemented in a flight computer while control system 252b is implemented in a charger (e.g., charger 110) that charges batteries 210 of battery bank 200 between flights.

Each instance of control system 252 can have the ability to broadcast messages to all BMS controllers 220 and to receive messages from each BMS controller 220. Messages sent by BMS controller 220 can include the unique identifier, enabling control system 252 to identify the origin of a received message. In embodiments where multiple control systems 252 are present, each BMS controller 220 can use prioritization logic to determine which control system 252 to accept certain messages from, and the active control system 252 can process messages received from BMS controllers 220. In various embodiments, isoSPI (developed by Linear Technology Corp.) or any other communication technologies that enable communications as described herein can be used.

In operation, control system 252 can generate a time sync message to all BMS controllers 220. As described below, each BMS controller 220 can use the time sync message to determine when to start an isolation resistance measurement for its battery 210. Each BMS controller 220 can operate independently of all others, without requiring ongoing coordination from control system 252.

Figure 3:
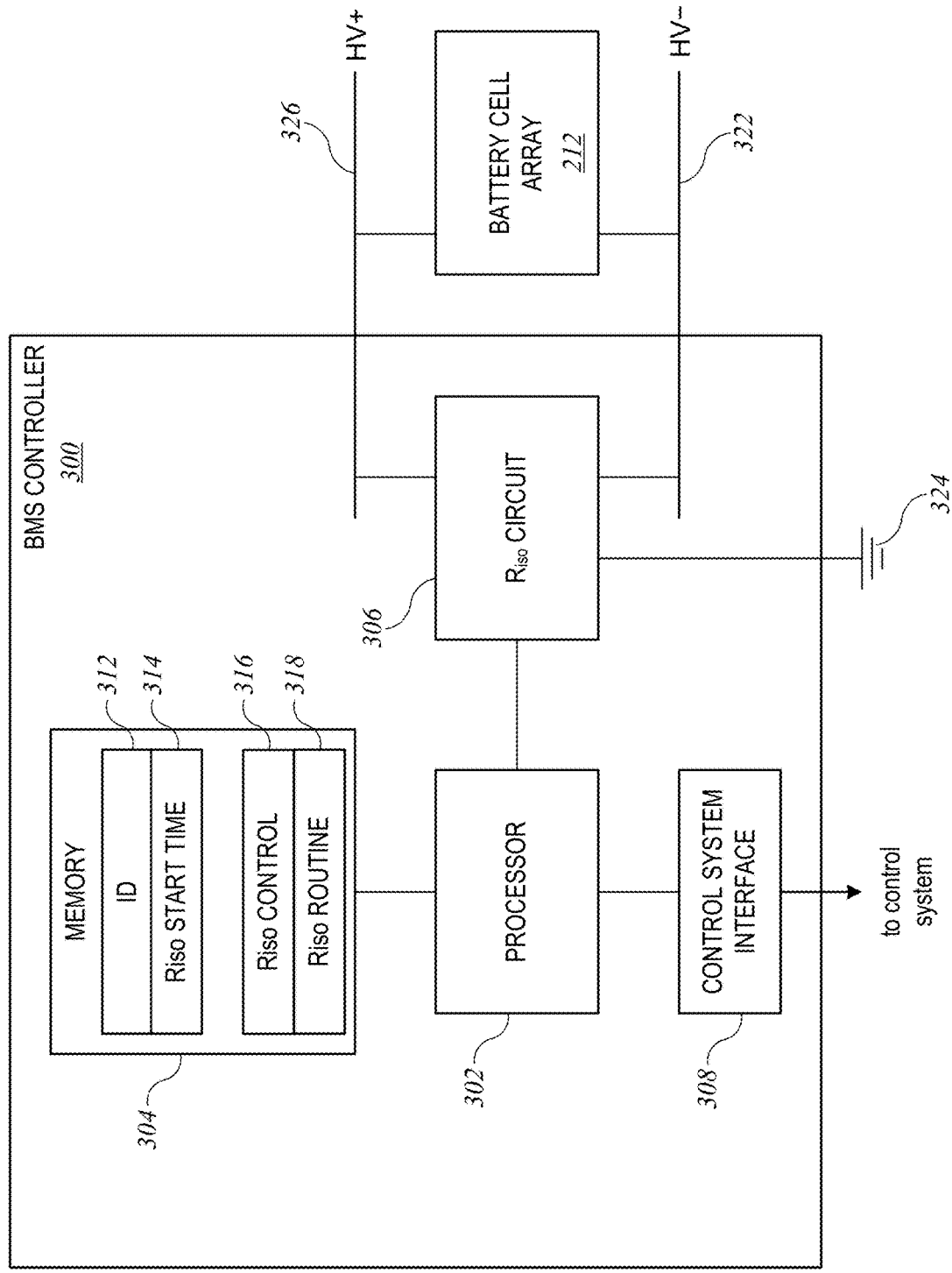
FIG. 3 shows an example of a BMS controller according to some embodiments

FIG. 3 shows an example of a BMS controller 300 according to some embodiments. BMS controller 300 can be an implementation of BMS controller 220 of FIGS. 2A and 2B and can be used, for instance, to implement battery monitoring system 108 of FIG. 1 for one battery.

BMS controller 300 includes a processor 302, memory 304, isolation resistance ($R_{iso}$) measurement circuit 306, and control system interface 308. Processor 302 can be a microprocessor, microcontroller, application specific integrated circuit (ASIC), field programmable gate array (FPGA), or other circuit implementing logic operations as described herein. In some embodiments, BMS controller 300 can be an embedded system, and as described below, computations can be implemented in a manner that can be performed in real time using a small, low-power processor. Memory 304 can include semiconductor-based memory (e.g., DRAM, SRAM), flash memory, magnetic storage, optical storage, or other computer-readable storage media. Memory 304 can store information used by BMS controller 300. For instance, memory 304 can store the unique (within a battery bank) identifier 312 assigned to BMS controller 300. Memory 304 can also store a start time 314 for a next isolation resistance measurement; the start time can be determined as described below. Memory 304 can also store program code instructions to be executed by BMS controller 300. For example, memory 304 can store an isolation resistance measurement routine 318 that includes program code instructions for performing a measurement of isolation resistance, examples of which are described below. Memory 304 can also store program code implementing an isolation resistance control module 316 that determines when to execute isolation resistance measurement routine 318, examples of which are also described below. It should be understood that BMS controller 300 can also perform other operations not related to isolation resistance measurement (e.g., operations related to monitoring other aspects of battery performance, battery state, or battery health).

Isolation resistance measurement circuit 306 can include hardware components to enable measurement of voltages between a first high voltage terminal (HV−) 322 and chassis ground 324 and between a second high voltage terminal (HV−) 326 and chassis ground 324. High voltage terminals 322, 326 are also connected to the negative and positive terminals of battery cell array 212. By executing isolation resistance control module 316 and isolation resistance measurement routine 318, processor 302 can control isolation resistance measurement circuit 306 to perform isolation resistance measurements according to isolation resistance measurement routine 318 and can receive voltages measured by isolation resistance measurement circuit 306.

Control system interface 308 can include hardware and/or software components that enable processor 302 to provide battery status information to a control system (e.g., control system 106 of FIG. 1 or control system(s) 252 of FIG. 2B). In various embodiments, the battery status information can include isolation resistance measurement data, other data or operating parameters received or measured from the battery cells, and/or fault notifications or other alerts, examples of which are described below.

It should be understood that BMS controller 300 is illustrative and that variations and modifications are possible. Each battery in a battery bank such as battery bank 200 can include its own BMS controller 300, which can operate independently of each other BMS controller 300 in the battery bank. BMS controller 300 can implement any number and combination of real-time monitoring operations, including but not limited to any one or more of the examples described below. In some embodiments, a battery monitoring system can also support other battery management operations such as calibration, self-testing, and so on.

Isolation Resistance Measurement Routine

Figure 4:
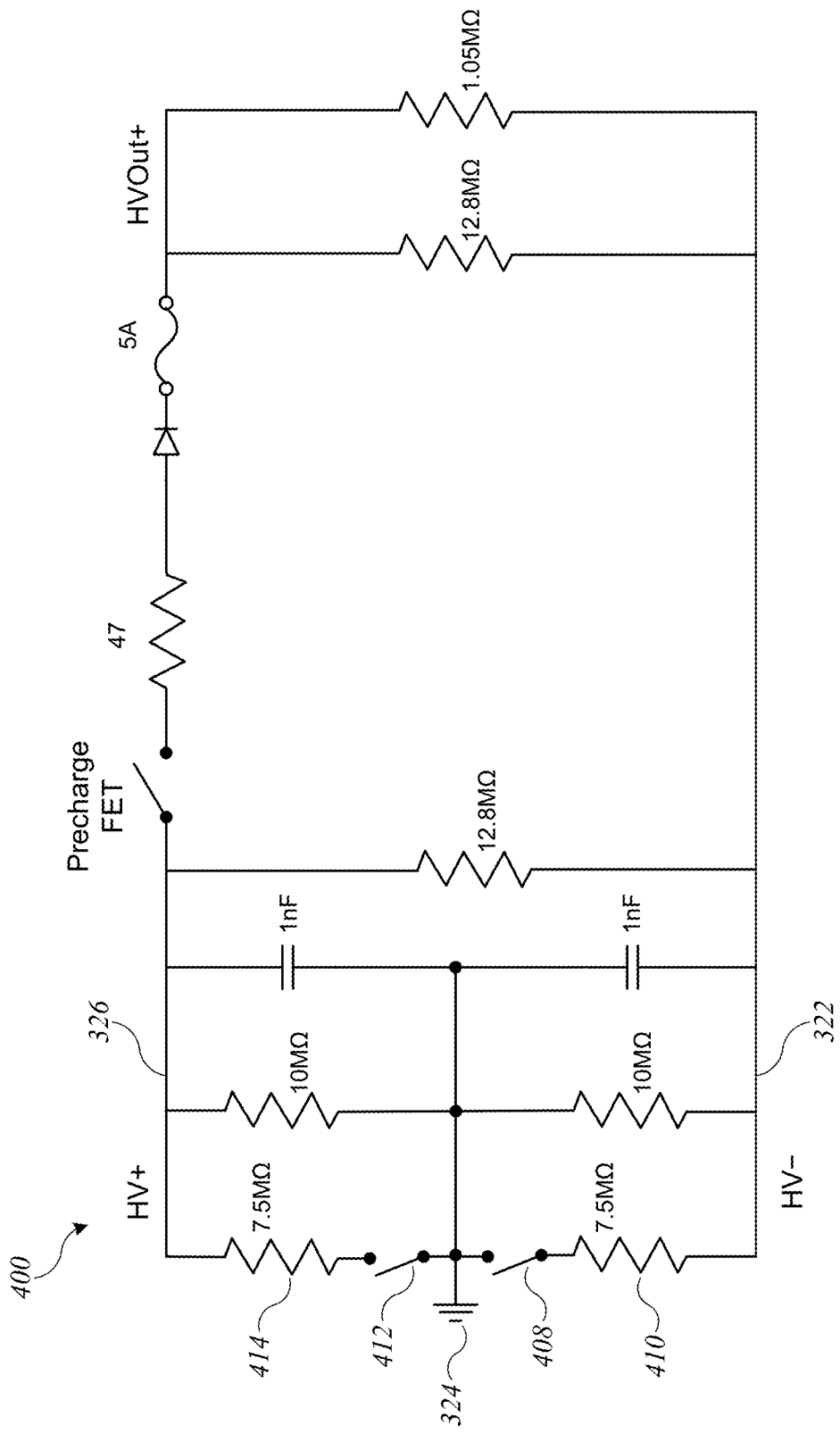
FIG. 4 is a schematic circuit diagram showing an example of an isolation resistance measurement circuit that can be used in some embodiments.

In some embodiments, an isolation resistance measurement is performed by BMS controller 300 operating isolation resistance measurement circuit 306. FIG. 4 is a schematic circuit diagram showing an example of an isolation resistance measurement circuit 400 that can be used as isolation resistance measurement circuit 306 in some embodiments. Circuit 400 can be connected between a first high voltage terminal (HV−) 322 and chassis ground 324 and between a second high voltage terminal (HV+) 326 and chassis ground 324. Voltages are measured between negative high voltage terminal 322 and ground 324 and between positive high voltage terminal 326 and ground 324. A first switch 408 allows a first test resistor 410 (which can be, e.g., a 7.5 MΩ resistor) to be coupled or uncoupled between negative high voltage terminal 322 and ground 324, and a second switch 412 allows a second test resistor 414 (which can have the same resistance as first test resistor 410, e.g., 7.5 MΩ) to be coupled or uncoupled between positive high voltage terminal 326 and ground 324.

Figure 5:
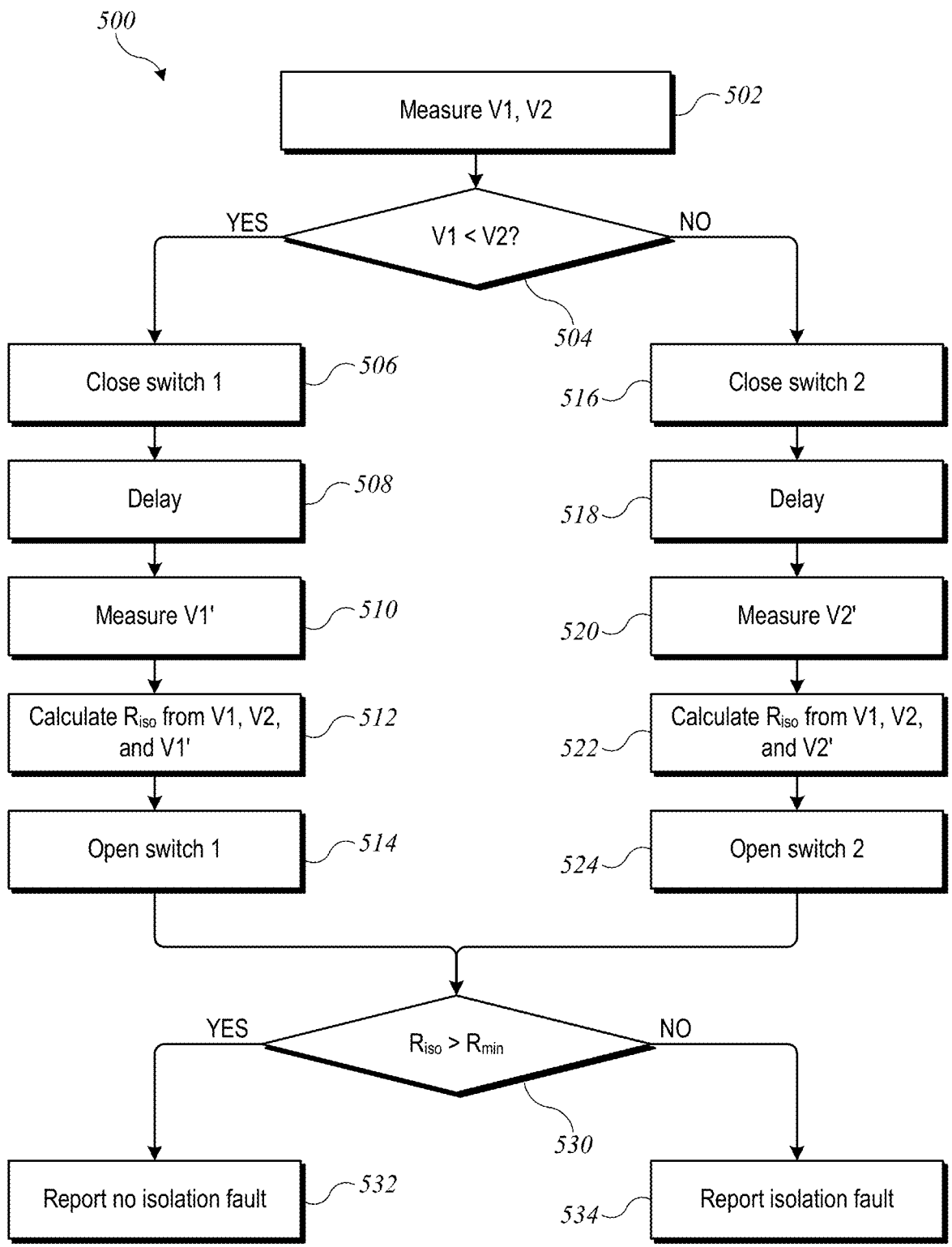
FIG. 5 is a flow diagram of a process for measuring isolation resistance that can be used according to some embodiments.

In operation, BMS controller 300 can use circuit 400 to perform isolation resistance measurements. FIG. 5 is a flow diagram of a process 500 for measuring isolation resistance that can be used according to some embodiments. Process 500 can be implemented as isolation resistance measurement routine 318 in BMS controller 300 of FIG. 3, using circuit 400 of FIG. 4. At block 502, with first switch 408 and second switch 412 both open, BMS controller 300 can measure a first voltage (V1) between negative high voltage terminal 322 and ground 324 and a second voltage (V2) between positive high voltage terminal 326 and ground 324. As used herein, both voltages are represented as non-negative numbers.

Figure 6B:
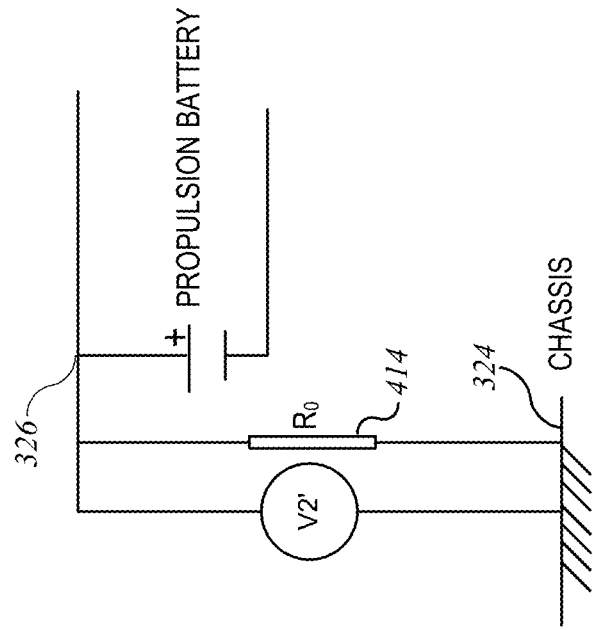
FIGS. 6A and 6B show a simplified schematic diagrams of a portion of the circuit of FIG. 4 when different switches are closed during isolation resistance measurements according to some embodiments.
Figure 6A:
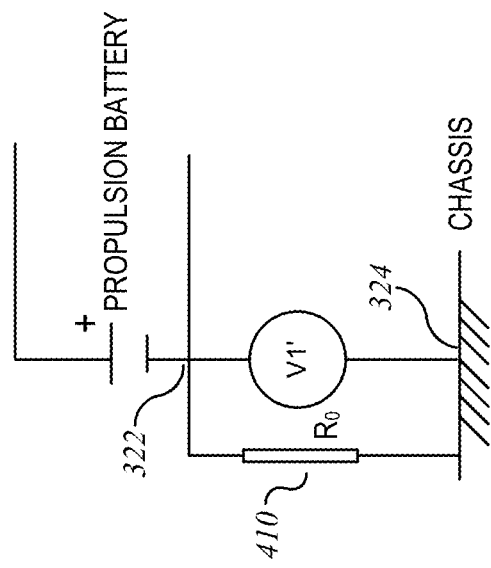

At block 504, BMS controller 300 can determine whether V1 is less than V2. If so, then at block 506, BMS controller 300 can close first switch 408 (leaving second switch 412 open). After a delay at block 508 to allow the voltage to stabilize, BMS controller 300 can measure the modified voltage V1' between negative high voltage terminal 322 and ground 324 at block 510. At block 512, BMS controller 300 can calculate the isolation resistance $R_{iso}$ from the measured V1, V2, and V1'. By way of illustration, FIG. 6A shows a simplified schematic diagram of circuit 400 when first switch 408 is closed. (Opening first switch 408 has the effect of removing first test resistor 410 from the circuit.) It will be apparent to one skilled in the art that $$R_{iso} = R_o \left(1 + \frac{V2}{V1}\right)\left(\frac{V1 - V1'}{V1'}\right) \quad (1)$$

where $R_o$ is the resistance of first test resistor 410.

Referring again to FIG. 5, at block 514, BMS controller 300 can open first switch 408; this resets circuit 400 for a subsequent iteration of process 500.

If, at block 504, V1 is not less than V2, then at block 516, BMS controller 300 can close second switch 412 (leaving first switch 408 open). After a delay at block 518 to allow the voltage to stabilize, BMS controller 300 can measure the modified voltage V2' between positive high voltage terminal 326 and ground 324 at block 520. At block 522, BMS controller 300 can calculate the isolation resistance $R_{iso}$ from the measured V1, V2, and V2'. By way of illustration, FIG. 6B shows a simplified schematic diagram of circuit 400 when second switch 412 is closed. (Opening second switch 412 has the effect of removing second test resistor 414 from the circuit.) It will be apparent to one skilled in the art that $$R_{iso} = R_o \left(1 + \frac{V1}{V2}\right)\left(\frac{V2 - V2'}{V2'}\right) \quad (2)$$

where $R_o$ is the resistance of second test resistor 414.

Referring again to FIG. 5, at block 524, BMS controller 300 can open first switch 408; this resets circuit 400 for a subsequent iteration of process 500.

At block 530, regardless of whether V1 is greater or less than V2, a value of isolation resistance $R_{iso}$ has been established. Accordingly, at block 530, BMS controller 300 can determine whether the calculated value of $R_{iso}$ exceeds a minimum resistance ($R_{min}$). The minimum resistance can be defined as desired, based on criteria appropriate for safe operation of the battery. Appropriate criteria may depend on the particular battery and in particular on the magnitude of the high voltage. In some embodiments, for a high voltage of 600-1000 V, $R_{min}$ can be 300 kΩ. If $R_{iso}$ exceeds $R_{min}$, BMS controller 300 can report no isolation fault at block 532. If, at block 530, $R_{iso}$ does not exceed $R_{min}$, BMS controller 300 can report an isolation fault at block 534. Examples of reporting of results and responsive actions are described below.

Using circuit 400 and process 500, BMS controller 300 can determine isolation resistance for a battery and report isolation faults to control system 252. It will be appreciated that other circuits and processes for determining isolation resistance can be substituted. In some embodiments, the BMS controller can make several measurements of voltage during a time period in which the voltage is expected to be stable, in order to confirm that the voltage is in fact stable, and in some embodiments, the BMS controller can also measure transient voltages (e.g., during the delay at block 508 or block 518), which may provide additional monitoring and/or diagnostic information related to isolation resistance.

Timing Control of Isolation Resistance Measurements

In an environment such as battery bank 200 of FIGS. 2A and 2B, there can be multiple batteries 210 coupled in parallel between high voltage bus lines 204, 206, with each battery 210 having its own BMS controller 220. Consequently, if two BMS controllers 220 attempt to measure isolation resistance at the same time (e.g., using different instances of circuit 400 and process 500), multiple resistors may be switched in parallel into the same circuit, and the resulting measurements may not be accurate.

Accordingly, some embodiments of the present invention provide a timing scheme that allows each BMS controller 220 to perform isolation resistance measurements at a different time, without requiring control system(s) 252 or any other central coordinator to manage the timing and without requiring BMS controllers 220 to communicate with each other. In embodiments described below, one instance of control system 252 can send a synchronization (time sync) signal to all BMS controllers 220, and each BMS controller 220 can determine when to perform isolation resistance measurement based on the time sync signal and its own unique identifier.

Figure 7:
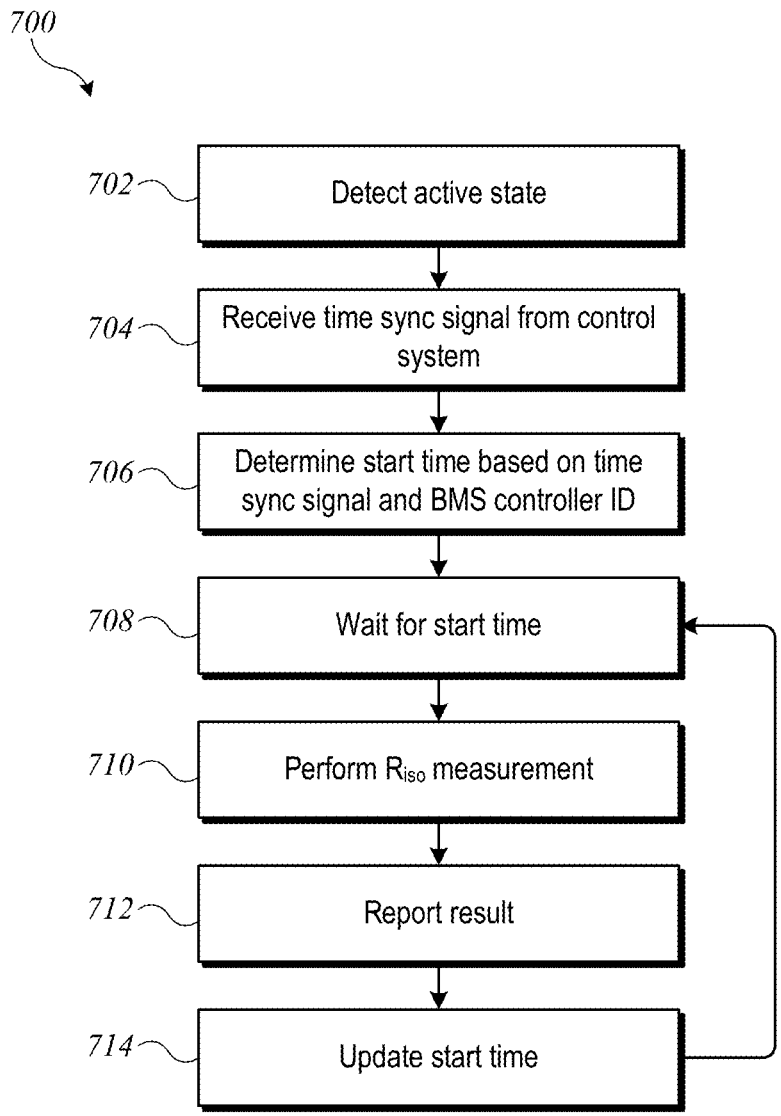
FIG. 7 is a flow diagram of a process for monitoring isolation resistance according to some embodiments.

FIG. 7 is a flow diagram of a process 700 for monitoring isolation resistance that can be implemented in a BMS controller 220 according to some embodiments. Process 700 assumes that the battery has an active state (during which the battery may be delivering power to a load or charging) and an idle state (during which the battery is neither charging nor delivering power and the battery may be disconnected from any load), and that monitoring of isolation resistance occurs during the active state.

Process 700 can begin, e.g., during an initialization stage of BMS controller 220. At block 702, BMS controller 220 can detect that an active state has been entered. For example, in some embodiments, preparations for using battery bank 200 to drive a load can include enabling a low voltage that may be used to power BMS controller 220. BMS controller 220 can detect when the low voltage has been enabled and use this event as a signal to enter the active state. In some embodiments, BMS controller 220 can remain in the active state until the low voltage is disabled.

At block 704, BMS controller 220 can receive a time sync signal from control system 252. In some embodiments, control system 252 delivers a time sync signal as a message that is sent to a message queue at regular intervals (e.g., 100 Hz), and BMS controller 220 can periodically poll the message queue to detect the time sync message. In embodiments where multiple control systems 252 are included, BMS controller 220 can have a separate message queue for each control system 252, and at block 704, BMS controller 220 can poll each message queue in turn. For example, a priority order among control systems 252 can be established, and each BMS controller 220 can poll the message queues according to the same priority order. In some embodiments where the control systems are implemented in redundant flight computers, each flight computer can be assigned a priority (primary, backup #1, backup #2, etc.). In some embodiments where one of the control systems is implemented in a charger, the charger can have lowest priority. In various embodiments, BMS controller 220 may be able to determine whether battery 210 is connected to a load or to a charger, and message queue(s) to be polled can be selected accordingly. Other techniques can be used, provided that all BMS controllers 220 receive the time sync signal from the same source.

The time sync message can include a time sync value ($t_{sync}$), which BMS controller 220 can use to determine when to perform various operations. In particular, at block 706, BMS controller 220 can use the time sync value and its own unique identifier to determine a start time ($t_{start}$) for a first isolation resistance measurement. For instance, BMS controller 220 can have a time counter that increments at regular time intervals (e.g., every 100 μs). BMS controller 220 can define the current time ($t_{current}$) as the current value of the time counter. BMS controller 220 can define the start time for the isolation resistance measurement as:

$$t_{start} = t_{current} + t_{sync} + (ID * t_d) \quad (3)$$

where ID is the unique identifier assigned to BMS controller 220 (e.g., as described above) and $t_d$ is a fixed time required to execute one instance of an isolation resistance measurement routine (e.g., process 500). Other definitions can be used, provided that each BMS controller 220 in a given battery bank calculates a different start time and the start times calculated by different BMS counters in a given battery bank are far enough apart that one BMS controller 220 can finish its measurement before the next BMS controller 220 begins.

At block 708, BMS controller 220 can wait for the start time to arrive. Arrival of the start time can be determined based on when the time counter of BMS controller 220 equals the start time calculated at block 706. (It should be understood that while process 700 waits, other processes can continue to execute in BMS controller 220.) At block 710, BMS controller 220 can perform a measurement of isolation resistance. For instance, BMS controller 220 can perform process 500. At block 712, BMS controller 220 can report results of the measurement to control system 252, e.g., by sending an appropriate message. Examples of reporting results are described below.

At block 714, BMS controller 220 can update its start time. For example, BMS controller 220 can compute $$t_{start} = t_{start} + t_{cycle} \quad (4)$$

where $t_{cycle}$ is an isolation-resistance measurement cycle time, which can be defined as a fixed period of time that is sufficiently long to allow each BMS controller 220 to perform one measurement of isolation resistance. For example, if $t_d$ is the time required for a single isolation resistance measurement, and N is the number of BMS controllers 220, then $t_{cycle} = N * t_d$ can be used. After updating the start time, process 700 can return to block 708 to wait for the (updated) start time to arrive. In some embodiments, updating the start time can include accounting for wraparound of the time counter in BMS controller 220. For instance, the time counter may count up to a maximum value, then reset back to zero. Accordingly, if Eq. (4) yields a start time counter value that is larger than the maximum counter value, the maximum counter value can be subtracted to account for the counter reset.

It should be understood that each BMS controller 220 in a battery bank such as battery bank 200 can independently execute process 700, and no communication between different BMS controllers 220 or coordination of isolation resistance measurements by control system 252 is required. As long as $t_d$ is sufficient time for one BMS controller 220 to complete an isolation resistance measurement and $t_{cycle}$ is at least $N * t_d$, each BMS controller 220 in battery bank 200 will perform its isolation resistance measurement at a different time from any other BMS controller in battery bank 200. Process 700 provides ongoing monitoring of isolation resistance while the battery (or battery bank) remains in the active state. In some embodiments, when the battery (or battery bank) exits the active state, e.g., when the low voltage is disabled, process 700 can end; process 700 can be restarted from block 702 when the battery (or battery bank) re-enters the active state.

Figure 8:
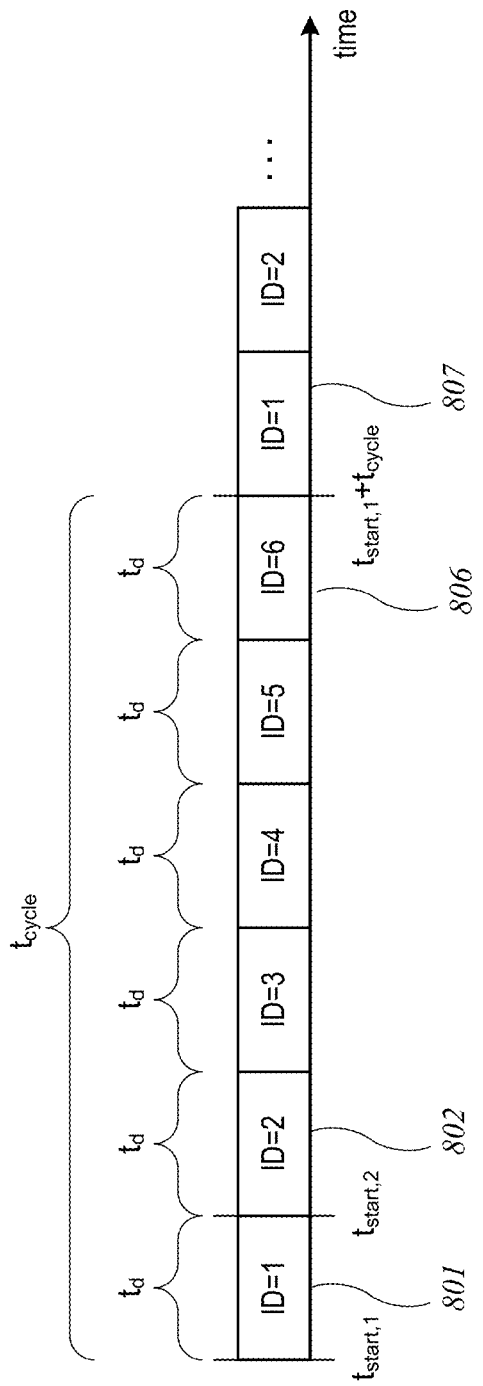
FIG. 8 shows a timing diagram for isolation resistance measurements according to some embodiments.

FIG. 8 shows a timing diagram for isolation resistance measurements in a battery bank when process 700 is used according to some embodiments. For purposes of illustration, battery bank 200 of FIG. 2B, which has six batteries 210 and six BMS controllers 220 (assigned IDs from 1 to 6) is used. Time $t_{start,1}$ is the start time computed by the BMS controller 220 with ID=1 at block 706 of process 700 using Eq. (3) above. Time $t_{start,2}$ is the start time computed by the BMS controller 220 with ID=2 at block 706 of process 700 using Eq. (3) above. As can be seen, $t_{start,2} = t_{start,1} + t_d$. Similarly, each other BMS controller 220 calculates a different start time, with start times computed by BMS controller with sequential identifiers ID separated by $t_d$.

Starting at time $t_{start,1}$, the BMS controller 220 with ID=1 performs an isolation resistance measurement, as indicated by time block 801. The measurement is completed by time $t_{start,2} = t_{start,1} + t_d$, at which time the BMS controller 220 with ID=2 begins its isolation resistance measurement, as indicated by time block 802. This progression continues until time $t_{start,1} + t_{cycle}$, when the last BMS controller 220 (ID=6) completes its first isolation resistance measurement (time block 806) and the BMS controller 220 with ID=1 begins a second isolation resistance measurement (time block 807). The cycles can continue indefinitely.

Measurement time $t_d$ can be a fixed parameter, with the same value used by all BMS controllers 220 in the battery bank. The value of $t_d$ can be selected as desired, provided that $t_d$ is long enough for a BMS controller to measure the voltages needed to compute isolation resistance. For instance, in embodiments where the BMS controllers use process 500, voltages V1 and V2 should be stable for the measurements at block 502. Closing either of the switches (at block 506 or block 516) perturbs both V1 and V2, and prior to measuring V1' or V2' (as the case may be), the BMS controller should wait (delay at block 508 or 518) for the voltages to stabilize again. After reopening the switch (at block 514 or block 524), the voltages do not immediately return to their nominal values, which means that additional recovery time should be provided before the next BMS controller attempts to measure V1 and V2. How much time should be provided between changing switch state and making a voltage measurement can be determined empirically for a given battery bank and isolation resistance measurement circuit, e.g., by opening the switches, observing the time needed for the voltages to stabilize, then closing one switch and again observing the time needed for the voltages to stabilize. In some embodiments, the BMS controller can make several measurements of voltage during a time window in which the voltage is expected to be stable, in order to confirm that the voltage is in fact stable, and in some embodiments, the BMS controller can make measurements of transient voltages outside the window of expected stability, which may provide additional monitoring and/or diagnostic information related to isolation resistance. In one example using circuit 400 of FIG. 4 and process 500, $t_d=10$ seconds provides sufficient time for the voltages to stabilize between measurements. Time $t_{cycle}$ can also be a fixed parameter, with the same value being used by all BMS controllers 220. The value can be selected as desired, provided that $t_{cycle} \geq N*t_d$. Selecting $t_{cycle}=N*t_d$ can provide essentially continuous monitoring of isolation resistance (in the sense that one BMS controller or another is always performing a measurement of isolation resistance during active operations). In some embodiments, less frequent monitoring may be desired, and longer $t_{cycle}$ allows less frequent monitoring.

It will be appreciated that process 700 is illustrative and that variations and modifications are possible. In some embodiments, each BMS controller 220 can start process 700 during initialization and continue running process 700 until the BMS controller 220 resets or is shut down. Monitoring of isolation resistance can begin when BMS controller 220 enters the active state. In some embodiments, monitoring can continue even if BMS controller 220 exits the active state, with results being discarded. Alternatively, while in an idle (or non-active) state, BMS controller 220 can suppress measurements of isolation resistance or reporting of results (blocks 710 and 712 of process 700) while continuing to update the start time (at block 714); measurements and reporting can be resumed when BMS controller 220 re-enters the active state, without requiring BMS controller 220 to recalculate a start time based on a time sync message.

The particular synchronization signal provided by control system 252 can be varied as desired, as long as all BMS controllers 220 receive a common time reference from the same source. After the initial synchronization, each BMS controller 220 can keep time independently, and further synchronization or coordination between BMS controllers 220 is not required. However, if desired, process 700 can be modified to include periodic resynchronization. For example, once per hour (or at some other time interval) as determined by its time counter, each BMS controller 220 can return to block 704 to detect a time sync signal and calculate a new start time at block 706.

Handling of Isolation Resistance Measurement Results

As described above, a BMS controller 220 can report results of isolation resistance measurements to control system 252. The particular format of the report and information contained there can be varied as desired. FIG. 9 shows a table 900 summarizing results that can be reported according to some embodiments. The results (outputs) in this example, shown in section 902, include a Boolean value (RiFault) indicating whether an isolation fault was detected, a quantitative measurement (RiValue) of the isolation resistance (which can be e.g., a floating-point number) and a Boolean value (RiValid) indicating whether the measurement is valid.

In some embodiments, the output values can depend on the operating mode of the BMS and the conditions observed during the isolation resistance measurement (columns 906). In this example, three operating modes (or states) of the BMS are shown (section 904): "active" mode, in which the battery may be powering a load; "maintenance" mode, in which the battery may be charging or not; and "idle" mode in which the battery is neither charging nor powering a load.

In the active mode, if isolation resistance measurement is off, no measurements are made. The outputs can include RiFault=False, RiValid=False, and RiValue=NAN (Not A Number) (since no measurement was made). This combination of outputs indicates that no measurement was made. If, in the active mode, isolation resistance measurement is on, there are three possible outcomes: $R_{iso}>R_{min}$, $R_{iso} \leq R_{min}$, or $R_{iso}$ could not be determined due to a measurement error. $R_{iso}>R_{min}$ is the desired operating condition, and the outputs in this case can be RiFault=False, RiValid=True, and RiValue equal to the measured resistance. $R_{iso} \leq R_{min}$ indicates an isolation fault, and the outputs in this case can be RiFault=True, RiValid=True, and RiValue equal to the measured resistance. (It should be understood that the edge case $R_{iso}=R_{min}$ can be treated as either a fault condition or not a fault condition, as desired.) If a measurement error occurs, then $R_{iso}$ is unknown, and the outputs can be RiFault=True, RiValid=False, and RiValue=NAN. The values of RiValid and RiValue distinguish a measurement error from a measured value $R_{iso} \leq R_{min}$.

In the maintenance mode, if the charger is off, no measurements are made, and the outputs can be the same as in the active state when isolation measurements are off. If the charger is on, then the same three outcomes as for the active mode are possible, and the conditions and outputs in each case correspond to conditions and outputs for the active state.

In the idle mode, no measurements are made, and the outputs can again be the same as in the active state when isolation measurements are off.

For each isolation resistance measurement, each BMS controller 220 can report the results as shown in table 900 (or results in a different format as desired) to control system 252. Control system 252 can implement decision logic to process the results. For instance, a result {RiFault=False, RiValid=True, RiValue=(a number)} indicates normal operation, and no action is needed. In some embodiments, control system 252 can log the result in an operating log and/or display the result on a monitor for an operator to observe. A result {RiFault=True, RiValid=True, RiValue=(a number)} indicates detection of an isolation fault. In some embodiments, control system 252 can automatically initiate protective action in response to a reported isolation fault. For example, control system 252 can generate an alert to an operator, who can take appropriate action. In some embodiments, if the load can be safely disabled or decoupled from battery bank 200, control system 252 can automatically disable or decouple the load in addition to alerting an operator. For instance, in the case of a battery-powered vehicle, disabling or decoupling the load from the battery bank while the vehicle is in motion may not be desirable; it may be preferable to alert an operator to the fault so that the operator can safely bring the vehicle to rest. In some embodiments, control system 252 can instruct some or all of BMS controllers 220 to halt isolation resistance monitoring if an isolation fault is detected.

A result {RiFault=True, RiValid=False, RiValue=NAN} indicates that no measurement was completed, and an isolation fault may or may not be present. In some embodiments, control system 252 can log this result. If the condition persists, control system 252 can alert an operator and/or take other protective action.

A result {RiFault=False, RiValid=False, RiValue=NAN} indicates that isolation resistance monitoring is not enabled. In some embodiments, control system 252 can log this result, and in some embodiments, control system 252 can determine whether (given the present operating condition) isolation resistance measurement should be enabled. If isolation resistance measurement should be but is not enabled, control system 252 can alert an operator and/or initiate a reset of the BMS controller(s).

It should be understood that the results and responsive actions described herein are merely examples. Depending on implementation, a variety of actions can be taken in response to a detected isolation fault or measurement failure. In some embodiments, certain events involving the load to which the battery is connected may cause transient effects on voltage or current that can interfere with the isolation resistance measurement. For instance, in the context of a battery-powered aircraft or other vehicle, when the motor becomes connected to the battery, a voltage spike can occur, which can result in erroneous measurements of isolation resistance. In some embodiments, control system 252 can determine when a connection event (or any other event that causes voltage fluctuations) occurs and ignore any reported isolation faults or errors that may be the result of voltage fluctuations. In some embodiments, BMS controllers 220 can detect an external event (e.g., connection to a motor or other load) that causes voltage fluctuations and temporarily suppress isolation resistance measurements during such events. For example, each BMS controller 220 can run a low-rate process (e.g., once per second) to detect external events and can skip one cycle of isolation resistance measurement when the low-rate process detects an event known to cause voltage fluctuations. The "no measurement made" results as shown in FIG. 9 can be reported for any cycle that is skipped.

ADDITIONAL EMBODIMENTS

While the invention has been described with reference to specific embodiments, those skilled in the art with access to this disclosure will appreciate that variations and modifications are possible. Systems and processes of the kind described herein can be used to monitor any number of batteries in a battery bank, and the systems and processes can be adapted to cells implemented using a variety of battery technologies. Isolation resistance monitoring can be performed and results reported in real time. A variety of different circuits and processing routines can be used to implement isolation resistance measurements; regardless of the particular circuit or processing routine, time-based control techniques as described herein can be applied to determine when each BMS controller performs its isolation resistance measurement.

In embodiments described above, a BMS controller in each battery performs isolation resistance monitoring independently of any other BMS controller in any other battery that may be present, and there is no need for the BMS controllers to communicate with each other. Further, as described above, each BMS controller can determine when to perform isolation resistance measurements based on a timing synchronization signal provided by a central control system to all BMS controllers. In other embodiments, a control system (such as control system 252) can send instructions to individual BMS controllers to perform an isolation resistance measurements and can send the instructions to different BMS controllers at different times. For example, the control system can send an instruction to a first BMS controller to perform an isolation resistance measurement. After the first BMS controller reports a result, the control system can send an instruction to a second BMS controller to perform an isolation resistance measurement, and so on. In this manner, the control system can coordinate operations of the BMS controllers so that different BMS controllers perform isolation resistance measurements at different times, without the BMS controllers needing to communicate with each other.

Computational operations of the kind described herein can be implemented in computer systems that may be of generally conventional design, such as a desktop computer, laptop computer, tablet computer, mobile device (e.g., smart phone), or the like. Such systems may include one or more processors to execute program code (e.g., general-purpose microprocessors usable as a central processing unit (CPU) and/or special-purpose processors such as graphics processors (GPUs) that may provide enhanced parallel-processing capability); memory and other storage devices to store program code and data; user input devices (e.g., keyboards, pointing devices such as a mouse or touchpad, microphones); user output devices (e.g., display devices, speakers, printers); combined input/output devices (e.g., touchscreen displays); signal input/output ports; network communication interfaces (e.g., wired network interfaces such as Ethernet interfaces and/or wireless network communication interfaces such as Wi-Fi); and so on. Computer programs incorporating various features of the claimed invention may be encoded and stored on various computer readable storage media; suitable media include magnetic disk or tape, optical storage media such as compact disk (CD) or DVD (digital versatile disk), flash memory, and other non-transitory media. (It should be understood that "storage" of data is distinct from propagation of data using transitory media such as carrier waves.) Computer readable media encoded with the program code may be packaged with a compatible computer system or other electronic device, or the program code may be provided separately from electronic devices (e.g., via Internet download or as a separately packaged computer-readable storage medium).

It should be understood that all numerical values used herein are for purposes of illustration and may be varied. In some instances ranges are specified to provide a sense of scale, but numerical values outside a disclosed range are not precluded.

It should also be understood that all diagrams herein are intended as schematic. Unless specifically indicated otherwise, the drawings are not intended to imply any particular physical arrangement of the elements shown therein, or that all elements shown are necessary. Those skilled in the art with access to this disclosure will understand that elements shown in drawings or otherwise described in this disclosure can be modified or omitted and that other elements not shown or described can be added.

The above description is illustrative and is not restrictive. Many variations of the invention will become apparent to those skilled in the art upon review of the disclosure. The scope of patent protection should, therefore, be determined not with reference to the above description, but instead should be determined with reference to the following claims along with their full scope or equivalents.

What is claimed is:

1. A battery bank comprising:
 a plurality of batteries, each battery including one or more battery cells;
 a pair of high voltage bus lines, wherein the plurality of batteries are coupled in parallel between the high voltage bus lines;
 a plurality of battery monitoring system controllers, each battery monitoring system controller connected to a corresponding one of the batteries; and
 a control system coupled to the plurality of battery monitoring system controllers,
 wherein each battery monitoring system controller includes an isolation resistance measurement circuit coupled to the corresponding one of the batteries and a processing logic circuit configured to:
  receive a time synchronization signal from the control system;
  determine, based on the time synchronization signal and a unique identifier assigned to each battery monitoring system controller, a start time for an isolation resistance measurement;

operate the isolation resistance measurement circuit to perform an isolation resistance measurement process starting at the start time;

report a result of the isolation resistance measurement to the control system;

update the start time based on a cycle time that is the same for each battery monitoring system controller; and at the updated start time, repeat the acts of performing the isolation resistance measurement process, reporting the result, and updating the start time.

2. The battery bank of claim 1 wherein the start time determined by each battery monitoring system controller is different from the start time determined by each other battery monitoring system controller and wherein the start times determined by different battery monitoring system controllers are separated by a duration sufficient to complete the isolation resistance measurement.

3. The battery bank of claim 1 wherein the result includes one or more of:
 a numerical value indicating a measured isolation resistance;
 a first indicator value indicating whether an isolation fault occurred; or
 a second indicator value indicating whether a measurement error occurred.

4. The battery bank of claim 1 wherein the isolation resistance measurement circuit includes:
 a first resistor and a first switch coupled in series between a first high voltage terminal of the battery cells and a chassis ground; and
 a second resistor and a second switch coupled in series between a second high voltage terminal of the battery cells and the chassis ground.

5. The battery bank of claim 4 wherein the processing logic circuit is further configured such that operating the isolation resistance measurement circuit includes:
 opening both the first switch and the second switch;
 measuring a first voltage between the first high voltage terminal of the battery cells and the chassis ground and a second voltage between the second high voltage terminal of the battery cells and the chassis ground;
 closing one of the first switch or the second switch based on comparing the first voltage and the second voltage;
 measuring a modified voltage, wherein if the first switch is closed, the modified voltage is measured between the first high voltage terminal and the chassis ground and if the second switch is closed, the modified voltage is measured between the second high voltage terminal and the chassis ground; and
 computing an isolation resistance based on the first voltage, the second voltage, and the modified voltage.

6. The battery bank of claim 1 wherein the control system includes a processing logic circuit configured to generate an alert message in the event that an isolation fault is detected.

7. The battery bank of claim 1 wherein the control system includes a processing logic circuit configured to prevent a load from becoming coupled to the battery bank in the event that an isolation fault is detected.

8. A battery module comprising:
 one or more battery cells;
 an isolation resistance measurement circuit coupled to the one or more battery cells; and
 a battery monitoring system controller coupled to the one or more battery cells and to the isolation resistance measurement circuit, the battery monitoring system controller including a processing logic circuit configured to:
  receive a time synchronization signal from a control system;
  determine, based on the time synchronization signal and a unique identifier assigned to the battery monitoring system controller, a start time for an isolation resistance measurement;
  operate the isolation resistance measurement circuit to perform an isolation resistance measurement process starting at the start time;
  report a result of the isolation resistance measurement to the control system;
  update the start time based on a cycle time that is the same for each battery monitoring system controller; and
  at the updated start time, repeat the acts of performing the isolation resistance measurement process, reporting the result, and updating the start time.

9. The battery module of claim 8 wherein the isolation resistance measurement circuit includes:
 a first resistor and a first switch coupled in series between a first high voltage terminal of the battery cells and a chassis ground; and
 a second resistor and a second switch coupled in series between a second high voltage terminal of the battery cells and the chassis ground.

10. The battery module of claim 9 wherein the processing logic circuit is further configured such that operating the isolation resistance measurement circuit includes:
 opening both the first switch and the second switch;
 measuring a first voltage between the first high voltage terminal of the battery cells and the chassis ground and a second voltage between the second high voltage terminal of the battery cells and the chassis ground;
 closing one of the first switch or the second switch based on comparing the first voltage and the second voltage;
 measuring a modified voltage, wherein if the first switch is closed, the modified voltage is measured between the first high voltage terminal and the chassis ground and if the second switch is closed, the modified voltage is measured between the second high voltage terminal and the chassis ground; and
 computing an isolation resistance based on the first voltage, the second voltage, and the modified voltage.

11. The battery module of claim 8 wherein the processing logic circuit is further configured such that determining the start time based on the time synchronization signal and the unique identifier assigned to the battery monitoring system controller includes:
 computing a time offset by multiplying a position index corresponding to the unique identifier by a delay time corresponding to an amount of time to complete an isolation resistance measurement; and
 adding the time offset to a base time determined from the time synchronization signal.

12. The battery module of claim 8 wherein the result includes one or more of:
 a numerical value indicating a measured isolation resistance;
 a first indicator value indicating whether an isolation fault occurred; or
 a second indicator value indicating whether a measurement error occurred.

13. A method comprising:
sending a time synchronization signal from a control system to each of a plurality of battery monitoring system controllers, wherein each battery monitoring system controller is coupled to a different one of a plurality of batteries in a battery bank and wherein each battery monitoring system controller stores a unique controller identifier; and
within each battery monitoring system controller:
determining, based on the time synchronization signal and the unique controller identifier, a start time for an isolation resistance measurement, wherein the start time determined by each battery monitoring system controller is different from the start time determined by each other battery monitoring system controller and wherein the start times determined by different battery monitoring system controllers are separated by a duration sufficient to complete the isolation resistance measurement;
in response to the start time arriving, performing an isolation resistance measurement process;
reporting a result of the isolation resistance measurement process to the control system;
updating the start time based on a cycle time that is the same for each battery monitoring system controller; and
in response to the updated start time arriving, repeating the acts of performing the isolation resistance measurement process, reporting the result, and updating the start time.

14. The method of claim 13 wherein the result of the isolation resistance measurement process includes an indicator of whether an isolation fault is detected.

15. The method of claim 14 further comprising:
generating, by the control system, an alert message in the event that an isolation fault is detected.

16. The method of claim 14 further comprising:
preventing, by the control system, a load from becoming coupled to the battery bank in the event that an isolation fault is detected.

17. The method of claim 14 further comprising:
instructing, by the control system, at least one of the battery monitoring system controllers to discontinue performing the isolation resistance measurement process in the event that an isolation fault is detected.

18. The method of claim 13 wherein the result of the isolation resistance measurement process includes one or more of:
a numerical value indicating a measured isolation resistance;
a first indicator value indicating whether an isolation fault occurred; or
a second indicator value indicating whether a measurement error occurred.

19. The method of claim 13 wherein performing the isolation resistance measurement process includes:
opening a first switch and a second switch in an isolation resistance measurement circuit;
measuring a first voltage between a first high voltage terminal of the battery and a chassis ground and a second voltage between a second high voltage terminal of the battery and the chassis ground;
closing one of the first switch or the second switch based on comparing the first voltage and the second voltage;
measuring a modified voltage, wherein if the first switch is closed, the modified voltage is measured between the first high voltage terminal and the chassis ground and if the second switch is closed, the modified voltage is measured between the second high voltage 12 terminal and the chassis ground; and
computing an isolation resistance based on the first voltage, the second voltage, and the modified voltage.

20. The method of claim 13 wherein determining the start time includes:
computing a time offset by multiplying a position index corresponding to the unique controller identifier by a delay time corresponding to an amount of time to complete the isolation resistance measurement process; and
adding the time offset to a base time determined from the time synchronization signal.

* * * * *